United States Patent [19]

Grote

[11] Patent Number: 4,484,658

[45] Date of Patent: Nov. 27, 1984

[54] SPEAKER SUPPORT ASSEMBLY

[75] Inventor: Warren H. Grote, Florissant, Mo.

[73] Assignee: American Trading and Production Corporation, Baltimore, Md.

[21] Appl. No.: 537,675

[22] Filed: Sep. 30, 1983

[51] Int. Cl.³ .............................................. H05K 5/00

[52] U.S. Cl. .................................... 181/150; 181/171; 179/146 R

[58] Field of Search ............... 181/141, 150, 171, 179; 179/146 E, 146 R, 181 W

[56] References Cited

U.S. PATENT DOCUMENTS 3,666,040 5/1972 Junk .................................... 181/150

FOREIGN PATENT DOCUMENTS 2706524 8/1978 Fed. Rep. of Germany ...... 181/150

*Primary Examiner*—Benjamin R. Fuller

*Attorney, Agent, or Firm*—Cohn, Powell & Hind

[57] ABSTRACT

The speaker support assembly includes a speaker connected to a baffle and brackets connected to the speaker and baffle. The baffle is located below a ceiling panel with the speaker extending through the ceiling panel. Support rods are attached to the brackets above the ceiling panel for supporting the speaker and baffle. The brackets include opposed wings through which the support rods extends. Bolts are used for attaching the rods to web portions of the brackets which are located intermediate to the wing portions. The support rods extend the width of the ceiling panel.

11 Claims, 4 Drawing Figures

FIG. 1
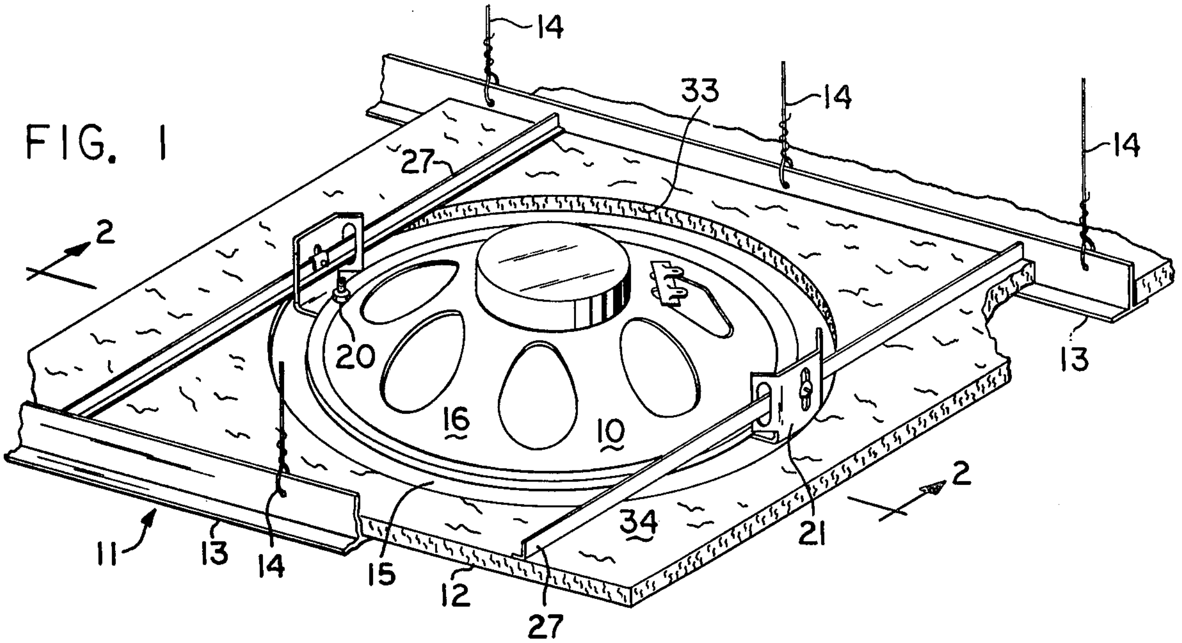
FIG. 2
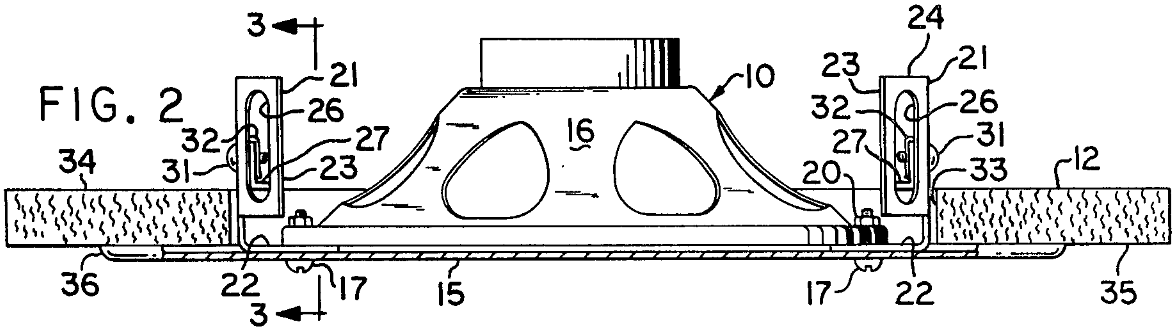
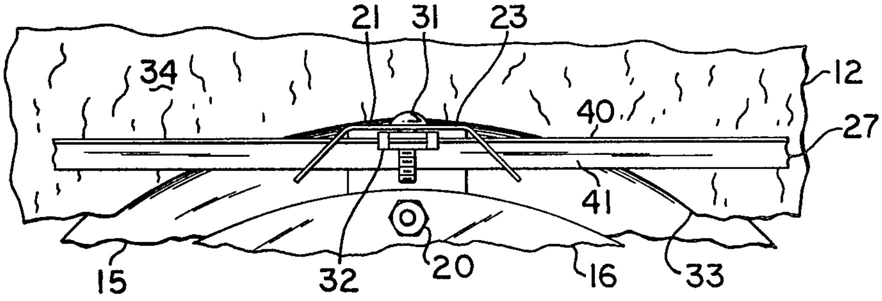
FIG. 4
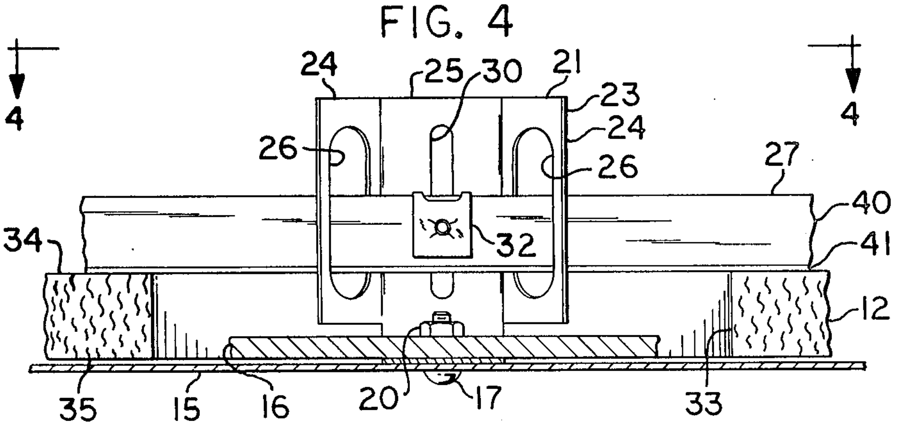
FIG. 3

SPEAKER SUPPORT ASSEMBLY

BACKGROUND OF THE INVENTION

This invention relates to a speaker support in general and particularly to a speaker baffle assembly for use in a ceiling. The speaker baffle assembly is particularly useful for mounting speakers in suspended type ceilings of the lay-in panel construction. In order to mount a speaker to such a ceiling, an opening is made in the ceiling for receiving a speaker. In prior art units, the speaker and baffle were typically attached to a ceiling panel by toggle bolts. In order to use toggle bolts it was necessary to make additional holes in the ceiling panel to receive the toggle bolts. Such an arrangement resulted in the entire weight of the speaker and its associated support assembly being applied to the ceiling panel at the toggle bolts, as well as requiring that the speaker assembly be held in position while the bolts were inserted.

SUMMARY OF THE INVENTION

This speaker support assembly provides a means for fastening a speaker to a ceiling without requiring additional holes in the ceiling for the fastening elements and provides a means for distributing the weight of the assembly as it is applied to the ceiling panel.

The speaker support assembly includes a baffle comprising an outer portion selectively located below the ceiling panel lower face and a speaker connected to the baffle and selectively extending through an opening in the ceiling panel. Bracket means are operatively connected to the speaker and baffle. Support rods are selectively attachable to the bracket means above the ceiling panel upper face and provide support for the speaker and baffle.

In one aspect of the invention the support rods extend substantially the width of the ceiling panel.

In another aspect of the invention, the bracket means includes a first portion connected to the baffle and an upstanding second portion which is perpendicular to the first portion. The bracket second portion includes a pair of opposed wing members and an interconnecting web portion. The wing members selectively receive the support rod. Each wing member includes an opening and the support rod passes through the openings of a pair of interconnected opposed wing members. In still another aspect of the invention the support rod passing through the wing members is selectively attached to the interconnecting web. In another aspect of the invention each support rod has a longitudinal midpoint and is connected to the bracket means at the longitudinal midpoint.

In one aspect of the invention a bolt means selectively attaches the support rod to the interconnecting web. In yet another aspect the bolt means is adjustable for selecting the dimension between the baffle and support rod. In yet another aspect the interconnecting web includes a slot, the bolt means are adjustable in the slot for adjusting said dimension.

BRIEF DESCRIPTION OF THE DRAWINGS

FIG. 1 is a fragmentary perspective view of a speaker assembly mounted to a ceiling panel;

FIG. 2 is a cross sectional view taken on line 2—2 of FIG. 1;

FIG. 3 is a cross sectional view taken on line 3—3 of FIG. 2, and

FIG. 4 is a fragmentary top view of the speaker baffle assembly and ceiling panel.

DESCRIPTION OF THE PREFERRED EMBODIMENT

Referring now by characters of reference to the drawing and first to FIG. 1, it will be understood that the speaker assembly generally indicated by 10 is designed to be mounted to a ceiling such as ceiling 11. The ceiling 11 being of the type commonly known in the industry and referred to as a lay in grid which utilizes ceiling panels 12 that are laid into a grid formed by T-members 13. The T-members 13 are supported as by support wires 14 which are connected in a conventional manner in the building structure (not shown).

The speaker assembly includes a lower plate comprising a baffle 15 as shown in FIG. 2. Attached to the baffle 15 is a speaker 16. Bolts 17 and nuts 20 are utilizes for connecting the speaker 16 and baffle 15. Brackets 21 are connected to the speaker and baffle as by the nuts and bolts 17 and 20.

The brackets include a horizontal first portion 22 and a substantially vertical upright second portion 23. Referring now to FIGS. 3 and 4, it will be understood that the second portion 23 includes opposed wing portions 24 and a central interconnecting web portion 25. The opposed wing portions 24 include opposed vertical slots 26 capable of receiving a support rod 27. The center web portion 25 includes a vertical slot 30 through which a fastening means comprising a bolt 31 passes. The bolt 31 passes through a support rod 27 and engages a clip nut 32 about the support rod 27.

The ceiling panel 12 includes an upper face 34, a lower face 35 and an opening 33 dimensioned to receive the speaker 16. The baffle 15, which is of conventional design, can be circular and provided with an upturned peripheral lip 36 which engages the lower side 35 of the ceiling panel 12. The support rod 27 is L-shaped with a vertical portion 40 and a horizontal portion 41. The horizontal portion 41 provides a surface for engagement with the upper surface 34 of the panel 12.

It is thought that the structural features and functional advantages of the speaker support assembly have become fully apparent from the foregoing description of parts but for completeness of disclosure a brief description of the assembly will be given.

In order to mount a speaker assembly 10 in a ceiling 11 it is first necessary that an appropriately sized opening 33 be provided in the panel 12 as by cutting. The opening must be large enough to accommodate the speaker 16 and the brackets 21. Preferrably, the opening 33 is of a smaller dimension than the diameter of the baffle 15 so that the baffle 15 will fully cover the opening 33.

It will be understood that prior to insertion of the speaker 16 ito the ceiling 11 the baffle 15, speaker 16 and brackets 21 have been operatively interconnected by the bolts 17 and nuts 20. The speaker 16 and brackets 21 are then inserted up through the opening 33 with the baffle 15 being located below the face 35 of the panel. The rods 27 can then be slipped through the openings 26 of the opposed wing portions 24. Once the rods 27 have both been inserted into their appropriate brackets 21, it will be seen that the speaker assembly 10 need not be manually held in position. It cannot fall from the opening 15 since the support rods 27 will engage the tops of the openings 26 of the wings 24 and thereby limit downward movement of the speaker 16 and baffle 15.

The clip nut 32 is a conventional clip on threaded member designed to be located about an opening (not shown) through the rod 27. The clip nut 32 can be positioned on the rod 27 prior to insertion of the rod 27 through the openings 26. When it is desired to fasten the rod 27 to the bracket 21 and rod 27 with the clip nut 32 is aligned with the slot 30 so that a bolt 31 will pass through the slot 30 and through the rod 27 and clip nut 32. Before tightening the bolt 31 the baffle 15 and speaker 16 can be manually raised so that the baffle upturned edges 36 engage the lower side 35 of the panel 12. While being held in engagement the rod 27 is placed in engagement with the upper surface 34 of the panel 12 and the bolt 31 is tightened at the clip nut 32 in order to firmly retain the rod 27 to the bracket 21. It will be seen that the slot 30 allows for adjustment of the spacing between the baffle 15 and rod 27 to conform to the thickness of the panel 12.

In the preferred embodiment the rod 27 is substantially equal to the width of the panel 12. Therefore the opposed ends of the rod 27 are located directly above portions of the T members 13 allowing the application of forces directly vertically from a support rod 27 through the panel 12 to the T members 13. Furthermore, the clip nuts 32 are positioned substantially at the longitudinal centers of the bars 27 for assuring that the speaker 16 and baffle 17 are centered transversely of the panel 12 for esthetic purposes. It will be understood that the support members 27 if desired can be longer than the dimension of the panel 12 which they transverse in which case they would be positioned so as to rest upon the top of the T members 13 and would not engage the panels 12. Alternatively, they can have a length shorter than the dimension of the panel 12 and directly engaging the upper surface 34 of the panel 12 thereby relying on the rigidity of the panel 12 to provide support for the speaker 16 and baffle 15.

I claim as my invention:

1. A speaker support assembly for use with suspended ceilings of the type including a plurality of ceiling panels having upper and lower faces and a ceiling grid selectively supporting the panels comprising:

(a) a baffle selectively locatable below a ceiling panel lower face, (b) a speaker connected to the baffle and selectively extendable through the ceiling panel, (c) bracket means operatively connected to the speaker and the baffle, and (d) support rods selectively attachable to the bracket means above the ceiling panel upper face and providing support to the speaker and baffle.

2. A speaker support assembly as defined in claim 1, in which:

(e) the support rods extend substantially the width of the ceiling panel.

3. A speaker support assembly as defined in claim 1, in which:

(e) the bracket means includes a first portion connected to the baffle and a second portion which is perpendicular to the first portion.

4. A speaker support assembly as defined in claim 3, in which:

(f) the bracket second portion includes a pair of opposed wing members and an interconnecting web portion, and the wing members selectively receiving the support rod.

5. A speaker support assembly as defined in claim 4, in which:

(g) each wing member of a pair of opposed wing members includes an opening, and (h) the support rod passes through the openings of the pair of opposed wing members.

6. A speaker support assembly as defined in claim 5, in which:

(i) the support rod passing through the wing openings is selectively attachable to the bracket at the interconnecting web.

7. A speaker support assembly as defined in claim 6, in which:

(j) bolt means selectively attaches the support rod to the interconnecting web.

8. A speaker support assembly as defined in claim 7, in which:

(k) the bolt means are adjustable for selecting the dimension between the baffle and the support rod.

9. A speaker support assembly as defined in claim 8, in which:

(l) the interconnecting web includes a slot, the bolt being adjustable in the slot for adjusting the dimension between the support rods and the baffle.

10. A speaker support assembly for use with suspended ceilings of the type including a plurality of ceiling panels having upper and lower faces and a ceiling grid selectively supporting the panels comprising:

(a) a speaker baffle selectively locatable below a ceiling panel lower face, (b) a speaker connected to the baffle and selectively extendable through the ceiling panel, (c) bracket means including a first portion connected to the speaker and the baffle, and a second portion which is substantially perpendicular to the first portion, (d) support rods selectively attachable to the bracket means above the ceiling panel upper face, the support rods extend substantially the width of the ceiling panel and providing support to the speaker and baffle, (e) the bracket second portion includes a pair of opposed wing members and an interconnecting web portion, each wing member being positioned at an angle to the web, (f) each wing member of a pair of opposed wing members including an opening, and (g) the support rod being selectively received through the openings of the pair of oppposed wing members.

11. A speaker support assembly as defined in claim 10, in which:

(h) the support rod extends substantially the width of the ceiling panel, and (i) each support rod has a longitudinal midpoint, and the bracket means is attached to the support rod of the midpoint.

* * * * *